United States Patent [19]

Stern et al.

[11] 4,328,389
[45] May 4, 1982

[54] INHERENT SPECTRUM-SPLITTING PHOTOVOLTAIC CONCENTRATOR SYSTEM

[75] Inventors: Theodore G. Stern; David M. Peterson, both of San Diego, Calif.

[73] Assignee: General Dynamics Corporation, San Diego, Calif.

[21] Appl. No.: 236,297

[22] Filed: Feb. 19, 1981

[51] Int. Cl.³ .......................................... H01L 31/04
[52] U.S. Cl. ................................................... 136/246
[58] Field of Search .......................... 136/246, 259, 248

[56] References Cited

U.S. PATENT DOCUMENTS

| 4,021,267 | 5/1977 | Dettling | 136/246 |
| 4,204,881 | 5/1980 | McGrew | 136/246 |

FOREIGN PATENT DOCUMENTS 2715471  10/1978  Fed. Rep. of Germany ...... 136/246

OTHER PUBLICATIONS

M. Duguay, "Solar Electricity: The Hybrid System Approach", *American Scientist*, vol. 65, pp. 422-427, (1977).
R. T. Taussig et al, "Photocell Heat Engine Solar Power Systems," *Proceedings 15th Intersociety Energy Conversion Engineering Conf.* (1980), pp. 119-124.
J. A. Cape et al, "Spectrally Split Tandem Cell Converter Studies," *Conf. Record, 13th IEEE Photovoltaic Specialists Conf.*, (1978), pp. 881-885.
*NASA Tech. Briefs*, Summer 1980, p. 169, "Improved Multispectral Solar-Cell Array".

*Primary Examiner*—Aaron Weisstuch
*Attorney, Agent, or Firm*—John R. Duncan; Frank D. Gilliam

[57] ABSTRACT

A solar energy splitting photovoltaic concentrator system that includes a first reflector that concentrates and directs sunlight to a high energy bandgap first photovoltaic array that absorbs and converts into electricity high energy photons. A second reflector formed integrally with the first photovoltaic array concentrates and reflects low energy photons back through the first photovoltaic array, which is transparent to the low energy photon, to a low energy bandgap second photovoltaic array that absorbs and converts the low energy photons.

11 Claims, 1 Drawing Figure

INHERENT SPECTRUM-SPLITTING PHOTOVOLTAIC CONCENTRATOR SYSTEM

BACKGROUND OF THE INVENTION

1. Field of the Invention

This invention relates to improvements in solar energy photovoltaic systems, and more particularly, but not by way of limitation, to an inherent spectrum splitting photovoltaic concentrator system.

2. Description of the Prior Art

In the past, it has been known to employ dichroic mirrors to break light into selected component colors or to combine selected component colored light into a predetermined color. In U.S. Pat. No. 2,642,487 issued to A. C. Schroeder light entered through a lens strikes intersecting dichroic mirrors which break the light down into its component colors of blue, green and red by passing one component and reflecting the other components. Light component utilization means are positioned in each component path. However, the present invention avoids the use of dichroic mirrors with their associated losses and instability.

In U.S. Pat. No. 3,554,634 issued to W. L. Duda et al, the concept of beam splitting was seen in an optical logical device which included means for selectively positioning a single light beam at a plurality of discrete positions, and means placed in the path of the positioned beam for uniquely encoding a plurality of different values of characteristic of the positioned beam in accordance with each discrete position of the beam to provide an optical output which may be conveniently read-out to determine the result. It is apparent though that the disclosed system was directed only to optical logic and not to concentrating solar energy to maximum utilization.

In U.S. Pat. No. 2,742,550 a low temperature dual photoconductive infrared radiation detector cell is disclosed in an effort to overcome the serious limitation of infrared detection cells for the detection of weak signals. This particular infrared detector provided a first coating of photoconductive material sensitive to a first infrared wavelength band on one side of a dielectric layer and on the other side of the dielectric layer another coating of photoconductive material is disposed that is sensitive to a second infrared wavelength. A reflection reducing coating transparent to infrared radiation is disposed on the radiation receiving side of the second coating and a mirror surface is provided on the base of the device to reflect upwardly to the photoconductive layers any radiation that may have passed through such photoconductive layers and thereby capture within the cell all received infrared radiation. Such device obviously was only limited to detecting low level infrared radiation and does not concentrate and split a solar light spectrum into various energy band components for maximum utilization.

U.S. Pat. No. 3,569,763 discloses another photoconductive device wherein first layers of a photoconductive material having one spectral response region and second layers of a different photoconductive material having a different spectral response region are laminated on one another in predetermined order to provide an image pickup tube having a high sensitivity to light for color television broadcast. This device does not physically concentrate and split a solar energy beam into different paths for maximum utilization.

SUMMARY OF THE INVENTION

Briefly stated, the present invention is directed to an inherent spectrum splitting photovoltaic concentrator system that includes a first reflector that receives solar energy and reflects and concentrates it in a light path toward a predetermined point.

A first photovoltaic means, which preferably has the second reflector formed as an integral back surface thereof, absorbs and converts into electricity photons falling above a first predetermined bandgap of energy. The first photovoltaic means is transparent to photons falling with energy less than the first bandgap of energy, so that it is these photons that comprise the light stream that is reflected and concentrated by a second reflector to fall upon a second photovoltaic means that absorbs and converts into electricity those photons with energies less than the bandgap energy of the first photovoltaic means. In the preferred embodiment, the first photovoltaic means converts into electricity many of those photons with energy greater than a predetermined energy level and is transparent to lower energy photons which pass through it and are reflected back and concentrated into a light stream that is absorbed and converted by the second photovoltaic means. Thus, the present invention discloses a novel means of splitting the solar spectrum into high and low energy bands and directing the energy into high and low bandgap solar photovoltaic cells respectively.

Other objects and advantages of the invention will be evident from the following detailed description when read in conjunction with an accompanying drawing.

BRIEF DESCRIPTION OF THE DRAWING

The drawing is a diagrammatic view of an inherent spectrum splitting photovoltaic concentrator system embodying the present invention.

DETAILED DESCRIPTION OF THE PREFERRED EMBODIMENT

Figure 1:
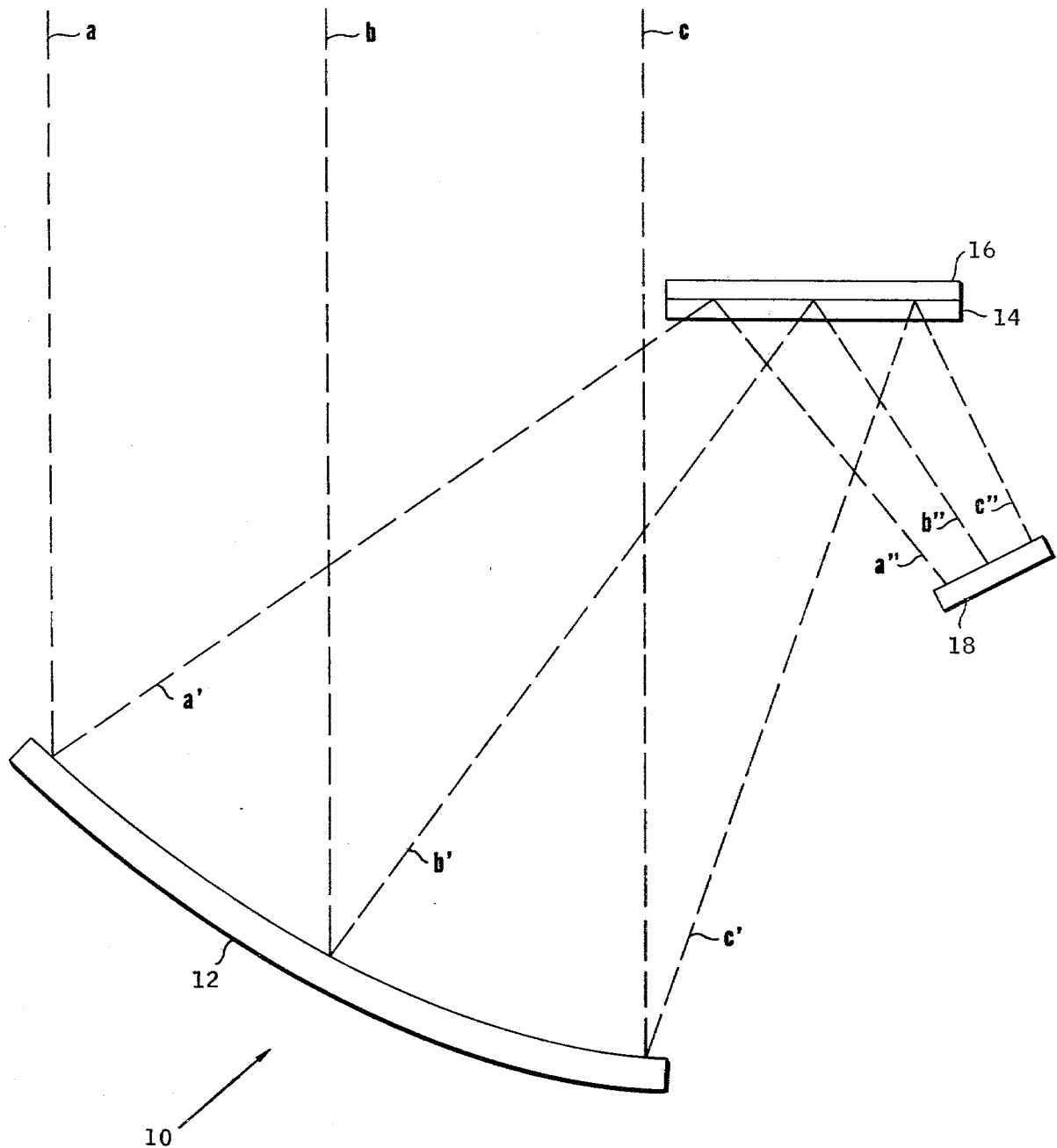

Referring now to the drawing, an inherent spectrum splitting photovoltaic concentrator system constructed in accordance with the present invention is designated by the reference character 10 and includes a first or primary reflector 12 positioned to receive a solar light stream designated by the letters a, b, and c. The first reflector 12, that is preferably a parabolic mirror and which may be constructed utilizing an aluminum or rhodium front surface, for example, concentrates and reflects the full spectrum of sunlight along lines a', b', and c' toward its focal point.

The light stream a', b', and c' then impinges upon a first photovoltaic means 14 spaced from the first reflector 12 preferably between said reflector 12 and its focal point. The first photovoltaic means 14 comprises an array of one or more high bandgap photovoltaic cells which absorb and convert into electricity those photons of the light stream a', b', and c' with energies greater than the predetermined cell bandgap energy and which are transparent to lower energy photons with energies less than the predetermined bandgap of the first photovoltaic cells 14.

The first photovoltaic means 14 is arranged and constructed to provide a second reflector 16 which is a back surface reflector integral with the photovoltaic array 14. The secondary reflector 16, which is preferably a planar, but could also be a concave, or convex reflector, then reflects those low energy photons that comprise the light stream a', b', and c' when it reaches the secondary reflector 16 back through the first photovoltaic means 14 and further concentrates the light stream into a light path a", b", and c" that is directed toward a predetermined focal point.

By way of example and not by way of limitation, the primary photovoltaic array 14 may comprise aluminum gallium arsenide cells that are provided with an integral aluminum or silver back surface reflector which forms the second reflector 16.

The light stream a", b", and c" is then intercepted prior to reaching the focal point by a second photovoltaic receiver 18 or secondary receiver which comprises an array of one or more low bandgap photovoltaic cells which absorb and convert into electricity those lower energy photons comprising the light stream a", b", and c". Exemplary as the final receiver 18 is an array of silicon photovoltaic or gallium arsenide cells.

For ease of illustration, the usual electrical connections and utilization devices for the first and second photovoltaic means 14 and 18 are omitted but are well within the scope of the skilled artisan to provide.

From the foregoing, it will be apparent that the present invention provides a novel solar concentrator and conversion module that concentrates and splits the full solar spectrum into high and low energy bands that are directed to high and low bandgap solar photovoltaic cell arrays. This has been accomplished without using dichroic mirrors and the attendant losses and instability ordinarily associated therewith. It is apparent that the illustrated invention is able to convert the full solar spectrum with substantial efficiency and would be particularly suited to utilization in a severe environment.

Changes may be made in the combination and arrangement of parts and elements as heretofore set forth in the specification and shown in the drawing without departing from the spirit and scope of the invention as defined in the following claims.

What is claimed as new and useful and desired to be secured by U.S. Letters Patent is:

1. An interent spectrum splitting photovoltaic concentrator system comprising:

a first reflector positioned to receive solar energy and adapted to reflect and concentrate such energy toward a predetermined point;

a second reflector positioned to receive solar energy reflected from the first reflector and adapted to reflect and concentrate such energy toward a predetermined point;

first photovoltaic means positioned adjacent to the second reflector so as to receive the solar energy reflected from the first reflector and to convert into electricity those photons with energies greater than the first predetermined bandgap energy, said means being transparent to photons with energies less than said first predetermined bandgap energy; and second photovoltaic means positioned to receive the solar energy reflected from the second reflector and to convert into electricity those photons with energies less than the bandgap energy of the first photovoltaic means.

2. The system of claim 1 wherein the first reflector is a parabolic reflector.

3. The system of claim 1 wherein the second reflector is a planar type reflector.

4. The system of claim 1 wherein the second reflector is a concave type reflector.

5. The system of claim 1 wherein the second reflector is a convex type reflector.

6. The system of claim 1 wherein the first photovoltaic means is composed of an array of photovoltaic cells which absorb and convert into electricity those photons with energy greater than the predetermined cell bandgap energy, but are transparent to lower energy photons which pass through said first photovoltaic means to the second reflector and are then reflected back through the first photovoltaic means to reception by the second photovoltaic means.

7. The system of claim 6 wherein the second photovoltaic means is composed of an array of low bandgap energy photovoltaic cells that absorb and convert into electricity the stream of lower energy photons reflected by the second reflector.

8. The system of claim 7 wherein the second reflector is formed as an integral back surface reflector of the second photovoltaic means.

9. The system of claim 8 wherein the first photovoltaic means is a plurality of aluminum gallium arsenide photovoltaic cells having an integral metallic back surface reflector.

10. The system of claim 9 wherein the second photovoltaic means is a plurality of photovoltaic silicon cells.

11. The system of claim 9 wherein the second photovoltaic means is a plurality of photovoltaic gallium arsenide cells.

* * * * *